United States Patent
Cho et al.

(10) Patent No.: US 11,018,212 B2
(45) Date of Patent: May 25, 2021

(54) ELECTRONIC APPARATUS

(71) Applicant: Samsung Display Co., Ltd., Yongin-Si (KR)

(72) Inventors: Youngjin Cho, Seoul (KR); Yangwan Kim, Hwaseong-si (KR); Joong-Soo Moon, Hwaseong-si (KR); Minwoo Byun, Seongnam-si (KR); Changkyu Jin, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/460,107

(22) Filed: Jul. 2, 2019

(65) Prior Publication Data

US 2020/0013844 A1    Jan. 9, 2020

(30) Foreign Application Priority Data

Jul. 4, 2018  (KR) .................. 10-2018-0077539

(51) Int. Cl.
*H01L 27/32*     (2006.01)
*G06F 3/044*     (2006.01)
(Continued)

(52) U.S. Cl.
CPC ........ *H01L 27/3276* (2013.01); *G06F 3/0412* (2013.01); *G06F 3/0443* (2019.05);
(Continued)

(58) Field of Classification Search
CPC .............. H01L 27/232; H01L 27/3276; H01L 27/3248; H01L 27/124; H01L 27/1248;
(Continued)

(56) References Cited

U.S. PATENT DOCUMENTS 9,046,955 B1   6/2015 Lee et al.
9,276,055 B1   3/2016 Son et al.
(Continued)

FOREIGN PATENT DOCUMENTS

EP    3291069       3/2018
KR    10-1725393    4/2017
(Continued)

OTHER PUBLICATIONS

European Search Report issued in corresponding European Application No. 19184258.2 dated Nov. 22, 2019.

*Primary Examiner* — Christopher E Leiby

(74) *Attorney, Agent, or Firm* — F. Chau & Associates, LLC

(57) ABSTRACT

An electronic apparatus includes a base substrate having an active area and a peripheral area adjacent to the active area. A plurality of pixels is disposed on the active area. The electronic apparatus also includes a plurality of power lines connected to the pixels. A power pad is disposed on a peripheral area and is configured to receive a power voltage. A power pattern is disposed on the peripheral area and connecting the power lines to the power pad. A plurality of sensing electrodes is disposed on the pixels in the active area. A plurality of sensing pads is disposed on the peripheral area and is electrically connected to the sensing electrodes. The sensing pads overlap with the power pattern.

23 Claims, 12 Drawing Sheets

(51) Int. Cl.
*G06F 3/041* (2006.01)
*H01L 51/00* (2006.01)
*H01L 51/52* (2006.01)
*H05K 1/14* (2006.01)
*H01L 27/12* (2006.01)

(52) U.S. Cl.
CPC ........ *H01L 27/323* (2013.01); *H01L 27/3248* (2013.01); *H01L 27/3258* (2013.01); *H01L 51/0097* (2013.01); *H01L 51/5253* (2013.01); *H05K 1/147* (2013.01); *G06F 2203/04102* (2013.01); *G06F 2203/04111* (2013.01); *H01L 27/124* (2013.01); *H01L 27/1248* (2013.01); *H01L 2251/5338* (2013.01); *H05K 2201/10128* (2013.01)

(58) Field of Classification Search
CPC ............... H01L 27/3246; H01L 27/322; H01L 27/3297; H01L 51/0097; H01L 51/5012; H01L 51/5246; H01L 51/0023; H01L 51/0096; H01L 51/0512; H01L 51/5253; H01L 2251/5338; H05K 1/147; H05K 2201/10128; G06F 3/0412; G06F 3/0443; G06F 3/044; G06F 2203/04102; G06F 2203/04111; G06F 2203/04103; G06F 2203/04112; G02F 1/1345; G02F 1/133305; G02F 1/133345; Y02E 10/549
See application file for complete search history.

(56) References Cited

U.S. PATENT DOCUMENTS

| | | | |
|---|---|---|---|
| 9,655,244 B1* | 5/2017 | Tsai | ........................ H05K 1/144 |
| 10,109,686 B2 | 10/2018 | Oh et al. | |
| 10,109,704 B2 | 10/2018 | Shin et al. | |
| 10,418,424 B2 | 9/2019 | Oh et al. | |
| 10,719,284 B2* | 7/2020 | Yamazaki | ............. G06F 1/1643 |
| 2015/0177893 A1* | 6/2015 | Lee | ................... G05B 19/4188 |
| | | | 345/173 |
| 2015/0248149 A1* | 9/2015 | Yamazaki | ............... G06F 1/263 |
| | | | 361/679.27 |
| 2017/0097711 A1* | 4/2017 | Aoki | ..................... G06F 3/0446 |
| 2018/0011586 A1 | 1/2018 | Zhang et al. | |
| 2018/0033969 A1 | 2/2018 | Kamijo et al. | |
| 2018/0107316 A1* | 4/2018 | Hanari | ................. G06F 3/0412 |
| 2018/0120987 A1 | 5/2018 | Kim et al. | |
| 2018/0275445 A1* | 9/2018 | Katagiri | ............ G02F 1/133305 |
| 2019/0014664 A1* | 1/2019 | Ahn | .................... G02F 1/133345 |
| 2019/0198801 A1* | 6/2019 | Kuon | .................... H01L 27/323 |
| 2019/0219863 A1* | 7/2019 | Tezen | ................ G02F 1/133308 |
| 2020/0020759 A1* | 1/2020 | Song | ................ G06F 3/04164 |

FOREIGN PATENT DOCUMENTS

| | | |
|---|---|---|
| KR | 10-2017-0106621 | 9/2017 |
| KR | 10-2017-0114029 | 10/2017 |
| KR | 10-2018-0006614 | 1/2018 |
| KR | 10-1908982 | 10/2018 |

* cited by examiner

ELECTRONIC APPARATUS

CROSS-REFERENCE TO RELATED APPLICATION

This application claims priority under 35 U.S.C. § 119 to Korean Patent Application No. 10-2018-0077539, filed on Jul. 4, 2018 in the Korean Intellectual Property Office, the disclosure of which is incorporated by reference in its entirety herein.

1. TECHNICAL FIELD

The present disclosure herein relates to an electronic apparatus, and more particularly, to an electronic apparatus having an increased reliability.

2. DISCUSSION OF RELATED ART

An electronic apparatus may be activated by an electrical signal. The electronic apparatus may include various electronic components such as a display unit for displaying an image and/or an input sensing unit for sensing an external input. The electronic components may be electrically connected to each other through signal lines that are variously arranged.

The number of the signal lines may be determined depending on the number of the electronic components and/or the processing environment, and the signal lines may be properly arranged in a predetermined panel area to prevent interference of electrical signals. The signal lines may receive external electrical signals through pads. As a processing speed and/or processing data of the electronic apparatus increases, the numbers of the signal lines and pads may increase. The possibility of experiencing mutual interference between the electronic components and/or between the signal lines may increase as the number of the signal lines and pads increases.

SUMMARY

The present disclosure may provide an electronic apparatus capable of minimizing or preventing deterioration in electrical reliability which may be caused by interference of electrical signals.

The present disclosure may also provide an electronic apparatus capable of improving bending reliability.

In an embodiment of the present inventive concepts, an electronic apparatus includes a base substrate including an active area and a peripheral area adjacent to the active area. A plurality of pixels is disposed on the active area. The electronic apparatus also includes a plurality of power lines connected to the pixels. A power pad is disposed on the peripheral area and is configured to receive a power voltage. A power pattern is disposed on the peripheral area and connecting the power lines to the power pad. A plurality of sensing electrodes is disposed on the pixels in the active area. A plurality of sensing pads is disposed on the peripheral area and is electrically connected to the sensing electrodes. The sensing pads overlap with the power pattern.

In an embodiment of the present inventive concepts, an electronic apparatus includes an electronic panel comprising a bending portion that is configured to be bent about a bending axis and a non-bending portion connected to the bending portion. A circuit board is connected to the electronic panel. The electronic panel includes a plurality of pixels disposed in the non-bending portion. Sensing electrodes are disposed in the non-bending portion and overlap with the pixels. Data pads are disposed in the bending portion and are connected to the circuit board. Power pads are disposed in the bending portion and are connected to the circuit board. A power pattern is disposed in the non-bending portion. The power pattern connects the power pads to the pixels. Sensing pads are disposed in the non-bending portion and are connected to the sensing electrodes. The sensing pads overlap with the power pattern.

In an embodiment of the present inventive concepts, an electronic apparatus includes a display unit that is configured to generate and display an image in a display area. The display unit includes a power pattern disposed in a non-display area. The power pattern connected to a plurality of power lines that are connected to at least one of a plurality of pixels to a power pad. An input sensing unit is configured to sense an external input in a sensing area. The input sensing unit includes a plurality of sensing pads electrically connected to sensing electrodes. The sensing pads overlap with the power pattern and at least one layer is disposed between the power pattern and the sensing pads.

In an embodiment, each of the pixels may include a thin film transistor which is covered by an insulating layer and includes a semiconductor layer, a control electrode spaced apart from the semiconductor layer, an input electrode connected to the semiconductor layer, and an output electrode disposed on the same layer as the input electrode and connected to the semiconductor layer, and a light emitting element which is disposed on the insulating layer and includes a first electrode, a second electrode disposed on the first electrode, and an emission layer disposed between the first electrode and the second electrode. The sensing pads may be disposed at a level between the light emitting element and the thin film transistor when viewed in a cross-sectional view.

In an embodiment, the power pattern may be disposed on the same layer as the output electrode.

In an embodiment, the insulating layer may include a first layer disposed between the first electrode and the output electrode and covering the output electrode, a second layer disposed on the first layer, and a third layer which is disposed on the second layer and on which the first electrode is disposed. The power pattern may be covered by the first layer.

In an embodiment, the sensing pads may be disposed between the second layer and the third layer.

In an embodiment, the electronic apparatus may further include a connection electrode disposed between the second layer and the third layer. The first electrode may penetrate the third layer so as to be connected to the connection electrode, and the connection electrode may penetrate the first and second layers so as to be connected to the output electrode.

In an embodiment, the electronic apparatus may further include a first circuit board connected to the power pad, and a second circuit board connected to the sensing pad. The sensing electrodes may receive an electrical signal through the second circuit board.

In an embodiment, the base substrate may include a bending portion bent about a bending axis extending in one direction, and a non-bending portion connected to the bending portion. The power pattern and the sensing pad may be disposed on the non-bending portion, and the power pad may be disposed on the bending portion.

In an embodiment, the electronic apparatus may further include a main pad disposed on the bending portion, and a bridge line extending in a direction intersecting the bending axis to connect the main pad to the sensing pad.

In an embodiment, the bridge line may be in direct contact with the sensing pad.

In an embodiment, the bridge line may include a first line connecting the main pad to the sensing pad, and a second line connecting the main pad to the sensing pad and including a portion spaced apart from the first line in a cross-sectional view. The first line, the second line and the sensing pad may be in direct contact with each other.

In an embodiment, the electronic apparatus may further include an organic layer disposed on the bending portion. The organic layer may be disposed between the first line and the second line.

In an embodiment, the electronic apparatus may further include a circuit board connected to the main pad and the power pad. The sensing electrodes may receive an electrical signal through the circuit board.

In an embodiment, the circuit board may include a first circuit board connected to the data pads and the power pads, and a second circuit board connected to the sensing pads. The sensing electrodes may receive an electrical signal through the second circuit board.

In an embodiment, the electronic apparatus may further include main pads disposed in the bending portion and connected to the circuit board, and bridge lines extending in a direction intersecting the bending axis to connect the main pads to the sensing pads. The sensing electrodes may receive an electrical signal through the circuit board.

In an embodiment, the electronic apparatus may further include a stress relaxation layer disposed in the bending portion and including an organic material. The bridge line may include a first line and a second line, which are spaced apart from each other with the stress relaxation layer interposed therebetween when viewed in a cross-sectional view.

In an embodiment, the sensing pad, the first line and the second line may be stacked when viewed in a cross-sectional view.

In an embodiment, the first line may be disposed on the second line, and at least a portion of the second line may be disposed on the same layer as the power pattern.

In an embodiment, the electronic apparatus may further include an encapsulation layer disposed between the pixels and the sensing electrodes and including at least one of an organic layer or an inorganic layer. The sensing electrodes may be disposed directly on the encapsulation layer.

BRIEF DESCRIPTION OF THE DRAWINGS

The accompanying drawings are included to provide a further understanding of the present inventive concepts, and are incorporated in and constitute a part of this specification. The drawings illustrate embodiments of the present inventive concepts and, together with the description, serve to explain principles of the inventive concepts. In the drawings.

DETAILED DESCRIPTION OF THE EMBODIMENTS

Figure 1A:
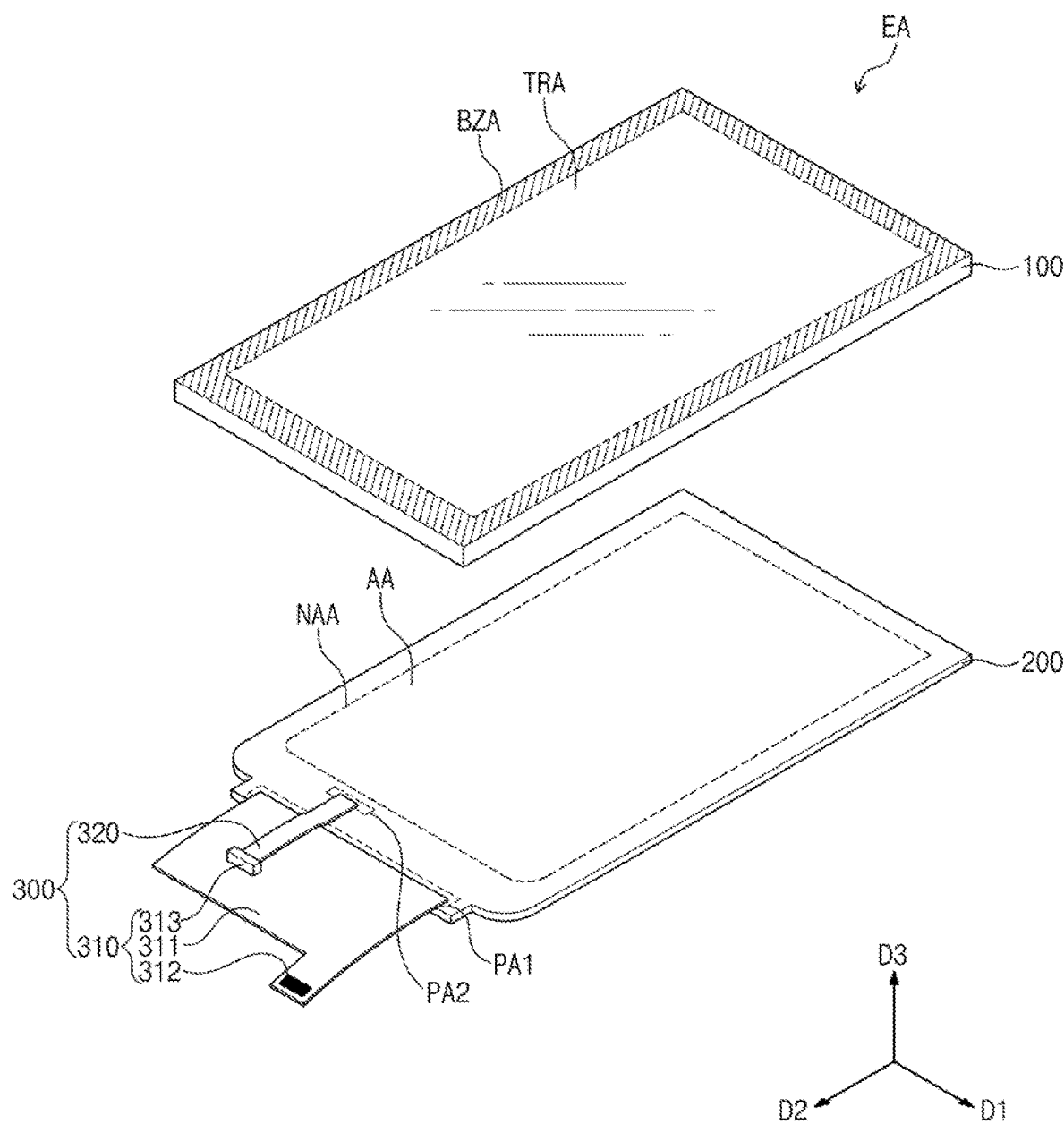
FIG. 1A is an exploded perspective view illustrating an electronic apparatus according to an embodiment of the present inventive concepts.

The inventive concepts now will be described more fully hereinafter with reference to the accompanying drawings, in which various embodiments are shown. The inventive concepts may, however, be embodied in many different forms, and should not be construed as limited to the embodiments set forth herein. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system).

Embodiments are described herein with reference to cross-sectional illustrations and/or plane illustrations that are idealized exemplary illustrations. In the drawings, the thicknesses of layers and regions may be exaggerated for clarity. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle may, typically, have rounded or curved features. Thus, the regions illustrated in the figures are schematic in nature and their shapes are not intended to illustrate the actual shape of a region of a device and are not intended to limit the scope of embodiments.

Hereinafter, embodiments of the present inventive concepts will be described in detail with reference to the accompanying drawings.

Figure 1B:
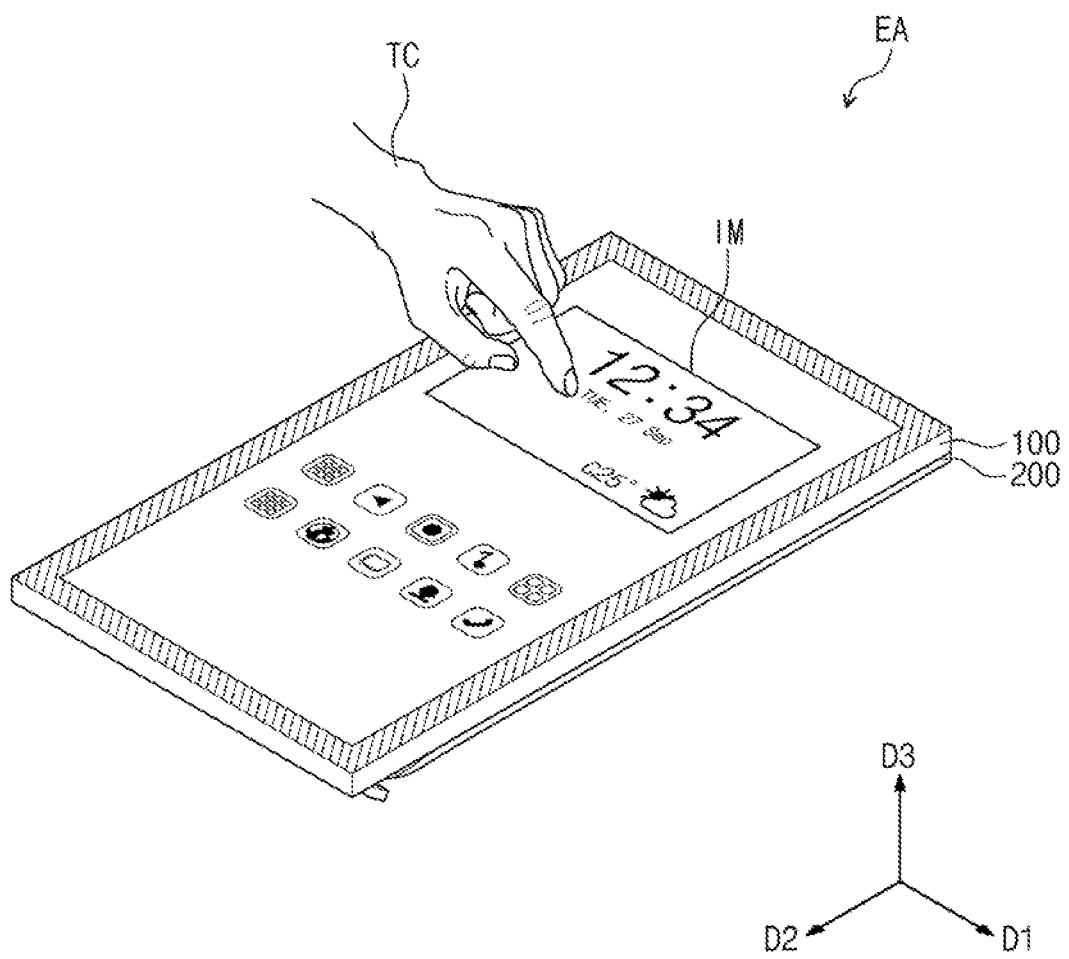
FIG. 1B is a perspective view illustrating the combined electronic apparatus of FIG. 1A according to an embodiment of the present inventive concepts.

FIG. 1A is an exploded perspective view illustrating an electronic apparatus according to an embodiment of the present inventive concepts, and FIG. 1B is a perspective view illustrating the combined electronic apparatus of FIG. 1A. Hereinafter, an embodiment of the present inventive concepts will be described with reference to FIGS. 1A and 1B.

An electronic apparatus EA may include a window member 100, an electronic panel 200, and a circuit board 300. The window member 100 may include a transmission area TRA and a bezel area BZA.

The transmission area TRA may transmit light incident thereto. A light transmittance of the bezel area BZA may be lower than a light transmittance of the transmission area TRA. The bezel area BZA may be adjacent to the transmission area TRA. In the embodiment shown in FIG. 1A, the bezel area BZA may surround the entire periphery of the transmission area TRA. However, embodiments of the present inventive concepts are not limited thereto. In another embodiment, the bezel area BZA may be adjacent to only a portion of an edge of the transmission area TRA.

The electronic panel 200 may include an active area AA and a peripheral area NAA. The electronic panel 200 may activate the active area AA by electrical signals. As shown in FIG. 2, the electronic panel 200 may display an image IM through the activated active area AA. For example, the electronic panel 200 may display the image in an upward direction, such as third direction D3. The electronic panel 200 may also sense an external input TC applied to the active area AA. In some embodiments, the electronic panel 200 may only display an image or sense an external input.

In the present embodiment, the transmission area TRA of the window member 100 may correspond to or overlap with the active area AA of the electronic panel 200. This configuration permits a user to easily view the image IM, displayed on the active area AA, through the transmission area TRA. The external input TC may include various embodiments. For example, the external input TC may include at least one of various kinds of external inputs such as a user's body part (e.g., a finger), light, heat, and/or pressure. In addition, the electronic apparatus EA may sense a proximity input as well as an input directly contacting the electronic apparatus EA.

The electronic panel 200 may include a peripheral area NAA that is positioned adjacent to the active area AA. The peripheral area NAA may surround an edge of the active area AA. However, embodiments of the present inventive concepts are not limited thereto. In another embodiment, the peripheral area NAA may be adjacent to only a portion of an edge of the active area AA.

Various kinds of signal lines and/or electronic devices for providing electrical signals to the active area AA may be disposed in the peripheral area NAA. The peripheral area NAA of the electronic panel 200 may be covered by the bezel area BZA of the window member 100 and thus may not be visible to the outside.

In the embodiment shown in FIG. 1A, the electronic panel 200 may include a first pad area PA and a second pad area PA2. The first pad area PA1 and the second pad area PA2 may be spaced apart from each other. A circuit board 300 may be coupled to the first pad area PA1 and the second pad area PA2 for connection to the electronic panel 200. The circuit board 300 may include a first circuit board 310 and a second circuit board 320. The first pad area PA1 and the second pad area PA2 may be spaced apart from the active area AA.

In an embodiment, at least a portion of the electronic panel 200 may be bent and may be coupled to the window member 100. For example, the portion of the peripheral area NAA in which the first pad area PA1 is disposed may be bent to be positioned under the electronic panel 200. Therefore, the circuit board 300 that is coupled to the first pad area PA1 and the second pad area PA2 may be assembled to be disposed on a rear surface of the electronic panel 200, thereby manufacturing the electronic apparatus EA. This will be described later in more detail.

A first circuit board 310 of the circuit board 300 may be connected to the electronic panel 200 through the first pad area PA1. The first circuit board 310 may provide a signal for controlling the displayed image IM and/or a power signal to the electronic panel 200. The first circuit board 310 may include a main board 311, an electronic device 312, and a connector 313.

The main board 311 may be substantially coupled to the electronic panel 200. For example, in one embodiment, the main board 311 may be electrically and physically coupled to the first pad area PA1 through a conductive adhesive member. The main board 311 may include signal lines.

The electronic device 312 may be mounted on the main board 311. The electronic device 312 may be connected to the signal lines of the main board 311 and thus may be electrically connected to the electronic panel 200. The electronic device 312 may generate and/or process various kinds of electrical signals.

As shown in the embodiment shown in FIG. 1A, the connector 313 may be mounted on the main board 311. The connector 313 may be connected to the signal lines of the main board 311. The connector 313 may function as a path which electrically connects the first circuit board 310 to external components.

The second circuit board 320 may be connected to the electronic panel 200 through the second pad area PA2. The second circuit board 320 may transmit/receive electrical signals which activate the active area AA of the electronic panel 200 in such a way that the active area AA senses the external input TC. The second circuit board 320 may provide electrical signals to the electronic panel 200 and/or may receive and process electrical signals generated from the electronic panel 200.

Meanwhile, the second circuit board 320 may be connected to the first circuit board 310 through the connector 313. Thus, the first circuit board 310 may also process electrical signals corresponding to the external input TC provided through the second circuit board 320 as well as electrical signals for displaying the image IM. However, embodiments of the present inventive concepts are not limited thereto. In another embodiment, the second circuit board 320 may be separated from the first circuit board 310 and may be controlled independently of the first circuit board 310.

Figure 2A:
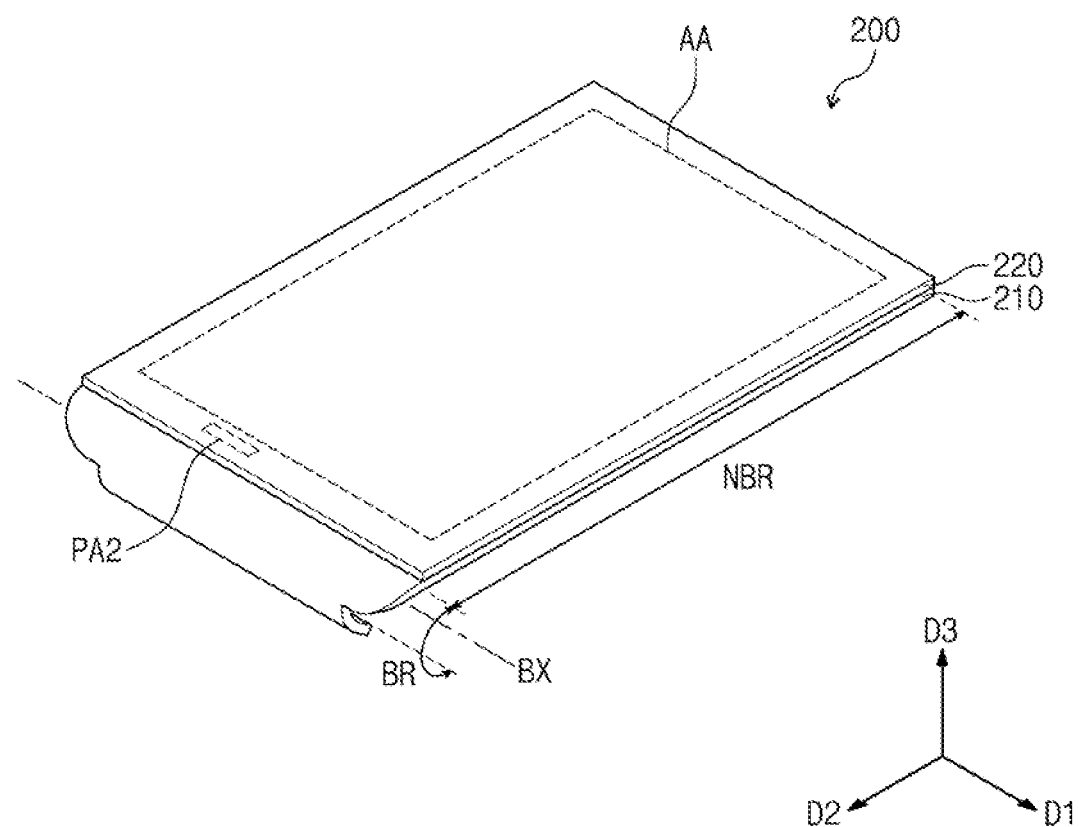
FIG. 2A is a perspective view illustrating an electronic panel according to an embodiment of the present inventive concepts.
Figure 2B:
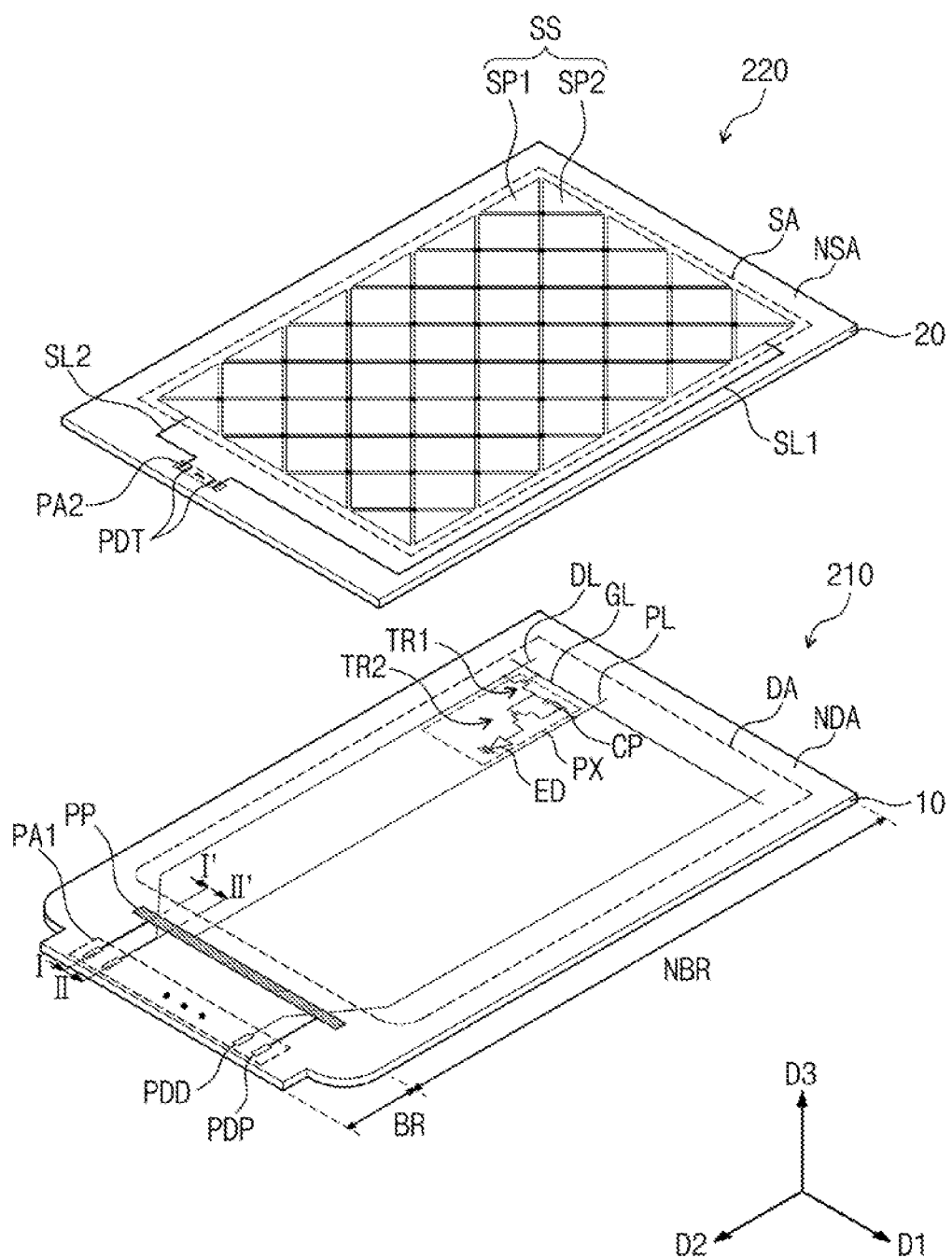
FIG. 2B is an exploded perspective view illustrating the electronic panel of FIG. 2A according to an embodiment of the present inventive concepts.

FIG. 2A is a perspective view illustrating an electronic panel according to an embodiment of the inventive concepts, and FIG. 2B is an exploded perspective view illustrating the electronic panel of FIG. 2A. Hereinafter, an embodiment of the present inventive concepts will be described with reference to FIGS. 2A and 2B.

Referring to FIG. 2A, the electronic panel 200 may include a bending portion BR and a non-bending portion NBR. The bending portion BR may be bent about a bending axis BX that extends in the first direction D1. The bending portion BR may be bent to surround the bending axis BX. In an embodiment, at least a portion of the bending portion BR may have a bend when viewed in a cross-sectional view defined by the second and third directions D2 and D3. In accordance with a bending degree of the electronic panel 200 and/or a width of the bending portion BR in the second direction D2, the bending portion BR may be bent in its entirety or it may be bent partially and include both a bent portion and a flat portion.

The non-bending portion NBR may be connected to the bending portion BR in the second direction D2. When the bending portion BR is bent, the non-bending portion NBR may be maintained substantially parallel to a plane defined by the first and second directions D1 and D2.

A boundary of the bending portion BR and the non-bending portion NBR may be defined in parallel to the bending axis BX. The electronic panel 200 may have a first side and a second side which extend in a direction parallel to the bending axis BX and are opposite to each other in a direction intersecting the bending axis BX. In this embodiment, the non-bending portion NBR may be an area from the boundary to one side of the first and second sides, and the bending portion BR may be the remaining area of the electronic panel 200.

The active area AA and the second pad area PA2 may be defined in the non-bending portion NBR. The active area AA and the second pad area PA2 may be exposed in the third direction D3. In an embodiment, the first pad area PA1 may be defined in the bending portion BR. Therefore, the first pad area PA1 may be disposed on a rear surface of the non-bending portion NBR and may not be exposed in the third direction D3. In embodiments, the first pad area PA1 may be formed on at least one of a curved surface or a flat surface of the bending portion BR. For example, when the bending portion BR has only a curved surface, the first pad area PA1 may be formed on the curved surface. Alternatively, when the bending portion BR has a curved portion and a flat portion connected to the curved portion, the first pad area PA1 may be formed on the flat portion or on both the flat portion and the curved portion.

The electronic panel 200 may include a display unit 210 and an input sensing unit 220. FIG. 2B illustrates the display unit 210 and the input sensing unit 220 separated from each other for the purpose of ease and convenience in description and illustration.

The display unit 210 may generate and display the image IM (see FIG. 1B) on the active area AA. The display unit 210 may include a base substrate 10 and a plurality of signal lines, such as a gate line GL, data line DL and a power line PL. The display unit 210 may also include a pixel PX, a power pattern PP, and a plurality of display pads PDP and PDD.

The base substrate 10 may have a shape corresponding to a shape of the electronic panel 200. For example, the base substrate 10 may be a component which substantially provides the bending portion BR and the non-bending portion NBR of the electronic panel 200. The base substrate 10 may have flexibility so that it may be bent. For example, the base substrate 10 may include an insulating polymer film.

The signal lines GL, DL and PL may be disposed on the base substrate 10. The gate line GL, the data line DL and the power line PL of the signal lines may transmit different electrical signals from each other.

In an embodiment, the gate line GL may extend in the first direction D1. The gate line GL may include a plurality of gate lines and the plurality of gate lines GL may be arranged and spaced apart from each other in the second direction D2. However, a single gate line GL is illustrated as an example in FIG. 2B for the purpose of ease and convenience in description and illustration.

The display unit 210 may further include a gate driving circuit which is mounted on the base substrate 10 to provide an electrical signal to the gate line GL. Alternatively, the display unit 210 may further include gate pads electrically connected to a gate driving circuit provided outside of the display unit 210.

In an embodiment, the data line DL may extend in the second direction D2. The data line DL may be electrically insulated from the gate line GL. The data line DL may include a plurality of data lines DL which may be arranged and spaced apart from each other in the first direction D1. However, a single data line DL is illustrated as an example in FIG. 2B for the purpose of ease and convenience in description and illustration. The data line DL may provide a data signal to the pixel PX.

In an embodiment, the power line PL may extend in the second direction D2. The power line PL may be electrically insulated from the gate line GL and the data line DL. The power line PL may include a plurality of power lines which may be arranged and spaced apart from each other in the first direction D1. However, a single power line PL is illustrated as an example in FIG. 2B for the purpose of ease and convenience in description and illustration. The power line PL may provide a power signal (hereinafter, referred to as a first power signal) to the pixel PX.

The pixel PX may be disposed in a display area DA of the display unit 210. The pixel PX may include a plurality of pixels. In an embodiment, the plurality of pixels PX may be arranged in a matrix form along the first direction D1 and the second direction D2 in the display area DA. However, a single pixel PX is illustrated as an example in FIG. 2B for the purpose of ease and convenience in description and illustration. The pixel PX may display light by an electrical signal to generate the image IM.

The pixel PX may include a first thin film transistor TR1, a second thin film transistor TR2, a capacitor CP, and a light emitting element ED. The first thin film transistor TR1, the second thin film transistor TR2, the capacitor CP and the light emitting element ED may be electrically connected to each other.

The first thin film transistor TR1 may be a switching element configured to control the turning on and turning off of the pixel PX. The first thin film transistor TR1 may be connected to the gate line GL and the data line DL. The first thin film transistor TR1 may be turned on by the gate signal provided through the gate line GL and may provide the data signal provided through the data line DL to the capacitor CP.

The capacitor CP may store a voltage corresponding to a potential difference between the first power signal provided from the power line PL and the data signal provided from the first thin film transistor TR1. The second thin film transistor TR2 may provide the first power signal provided from the power line PL to the light emitting element ED in response to the voltage stored in the capacitor CP.

The light emitting element ED may generate light or control the amount of light by an electrical signal. For example, the light emitting element ED may include an organic light emitting element, a quantum dot light emitting element, an electrophoretic element, or an electrowetting element.

The light emitting element ED may be connected to a power terminal and may receive a second power signal different from the first power signal. A driving current corresponding to a difference between the second power signal and the electrical signal provided from the second thin film transistor TR2 may flow through the light emitting element ED, and the light emitting element ED may generate light corresponding to the driving current.

However, embodiments of the present inventive concepts are not limited thereto. The components of the pixel PX may be variously modified or changed and may be variously arranged.

A power pattern PP may be disposed in a non-display area NDA of the display unit 210. The power pattern PP may be included in the non-bending portion NBR. In an embodiment, the power pattern PP may have a rectangular shape. The long side of the rectangular-shaped power pattern PP may extend in the first direction D1 and the short side may extend in the second direction D2. The power pattern PP may be electrically connected to the power line PL. The same electrical signal may be provided to the power pattern PP and the power line PL.

A plurality of display pads, which may include at least one power pad PDP and at least one data pad PDD, may be disposed in the non-display area NDA. The first pad area PA1 may be defined as a portion of the non-display area NDA in which the display pads PDP and PDD are disposed. As described above, the first circuit board 310 (see FIG. 1A) may be coupled to the first pad area PA1. The first circuit board 310 may be electrically connected to the electronic panel 200 through the display pads PDP and PDD disposed in the first pad area PA1.

The data pad PDD may be connected to the data line DL. The data line DL may extend from the display area DA to the data pad PDD via the power pattern PP. The data line DL may receive the data signal from the outside through the data pad PDD.

However, embodiments of the present inventive concepts are not limited thereto. In another embodiment, the data line DL may be disposed in the display area DA, and the display unit 210 may further include a separate bridge line which is disposed in the non-display area NDA to connect the data line DL to the data pad PDD. In this embodiment, the bridge line may be connected to each of the data line DL and the data pad PDD through a contact hole or may be in direct contact with each of the data line DL and the data pad PDD.

The power pad PDP may be connected to the power pattern PP. The power pattern PP may transmit the first power signal provided from the outside to the power line PL through the power pad PDP. A bridge line connecting the power pattern PP to the power pad PDP may be integrally formed with the power pattern PP as a single unitary body or may be provided on a different layer. This will be described later in more detail.

The input sensing unit 220 may be disposed on the display unit 210. The input sensing unit 220 may sense the external input TC (see FIG. 1B) to obtain information on a position and/or strength of the external input TC. The input sensing unit 220 may include a sensing insulating layer 20, a sensing electrode SS, a plurality of sensing lines SL1 and SL2, and a plurality of sensing pads PDT.

The input sensing unit 220 may include a sensing area SA and a non-sensing area NSA. The sensing area SA may sense the external input TC. The sensing area SA may overlap with the display area DA. In the embodiment shown in FIG. 2B, the active area AA may include the sensing area SA and the display area DA.

The non-sensing area NSA may be adjacent to the sensing area SA. The non-sensing area NSA may surround an edge of the sensing area SA. However, embodiments of the present inventive concepts are not limited thereto. In other embodiments, the non-sensing area NSA may be adjacent to only a portion of the edge of the sensing area SA or may be omitted.

The sensing electrode SS may be disposed in the sensing area SA. The sensing electrode SS may include a first sensing electrode SP1 and a second sensing electrode SP2 which receive different electrical signals from each other. The sensing electrode SS may obtain information on the external input TC by using a change in capacitance between the first sensing electrode SP1 and the second sensing electrode SP2.

In an embodiment, the first sensing electrode SP1 may extend in the first direction D1. The first sensing electrode SP1 may be provided in plurality, and the plurality of first sensing electrodes SP1 may be arranged and spaced apart from each other in the second direction D2. In an embodiment, the second sensing electrode SP2 may extend in the second direction D2. The second sensing electrode SP2 may include a plurality of second sensing electrodes. The plurality of second sensing electrodes SP2 may be arranged and spaced apart from each other in the first direction D1.

The sensing lines SL1 and SL2 and the sensing pads PDT may be disposed in the non-sensing area NSA. The sensing pads PDT may be connected to the sensing lines SL1 and SL2, respectively. The sensing lines SL1 and SL2 may include a first sensing line SL1 and a second sensing line SL2. The first sensing line SL may connect the first sensing electrode SP1 to one of the sensing pads PDT and may transmit an electrical signal provided from the outside through a sensing pad PDT to the first sensing electrode SP1. The second sensing line SL2 may connect the second sensing electrode SP2 to another of the sensing pads PDT and may transmit an electrical signal provided from the outside through the sensing pad PDT to the second sensing electrode SP2.

The portion of the non-sensing area NSA, in which the sensing pads PDT are disposed, may be defined as the second pad area PA2. As described above, the second circuit board 320 (see FIG. 1A) may be coupled to the second pad area PA2. The second circuit board 320 may be electrically connected to the electronic panel 200 through the sensing pads PDT disposed in the second pad area PA2.

Meanwhile, in the present embodiment, the second pad area PA2 of the input sensing unit 220 may overlap with the power pattern PP of the display unit 210. For example, the sensing pads PDT may be disposed on a layer different from a layer on which the power pattern PP is disposed, and the sensing pads PDT may overlap with the power pattern PP. The area in which the sensing pads PDT are disposed may be designed independently of the area in which the power pattern PP is disposed, thereby preventing mutual interference therebetween. This will be described later in more detail.

Figure 3A:
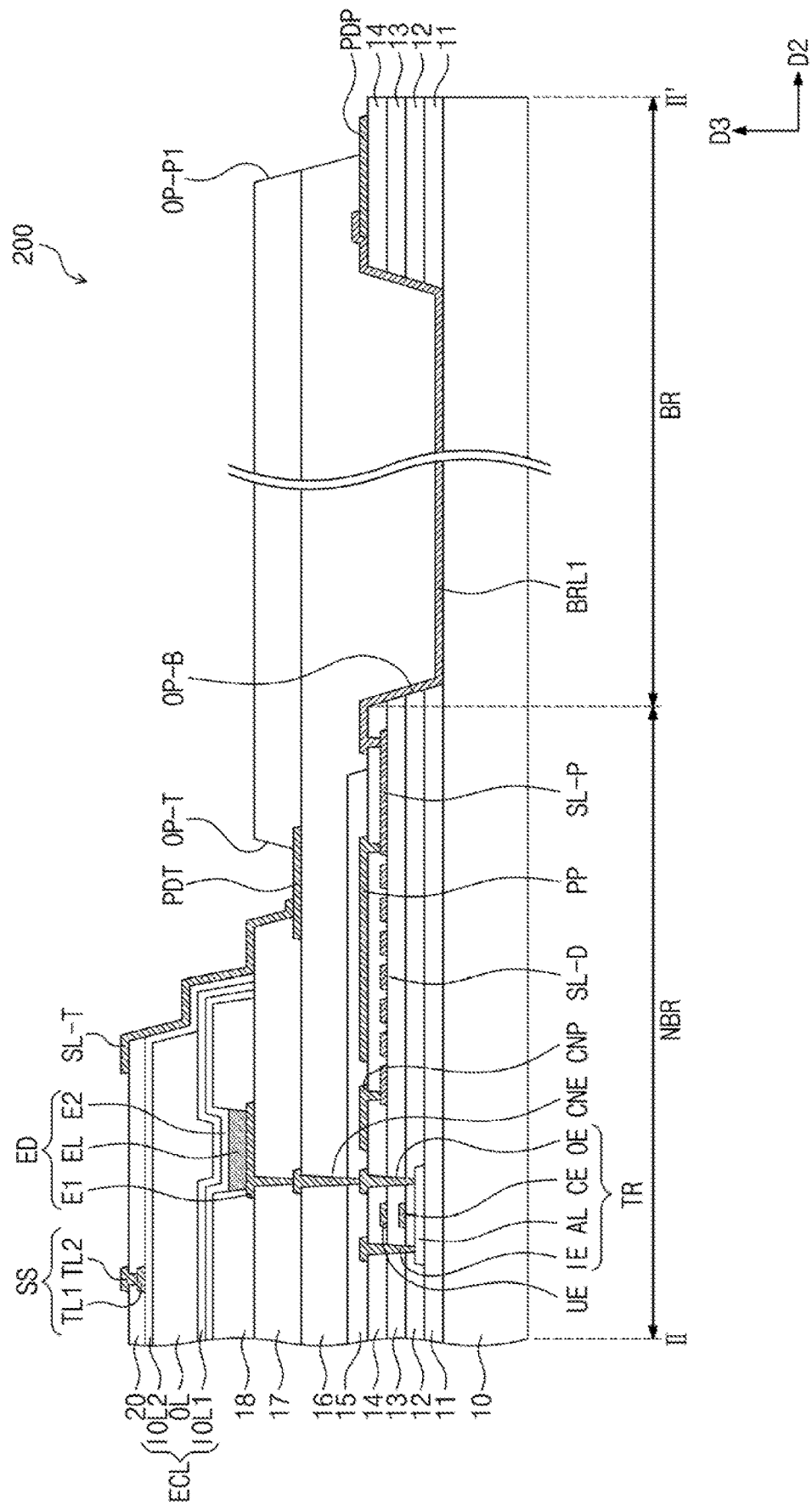
FIG. 3A is a cross-sectional view taken along line I-I' of FIG. 2B according to an embodiment of the present inventive concepts.
Figure 3B:
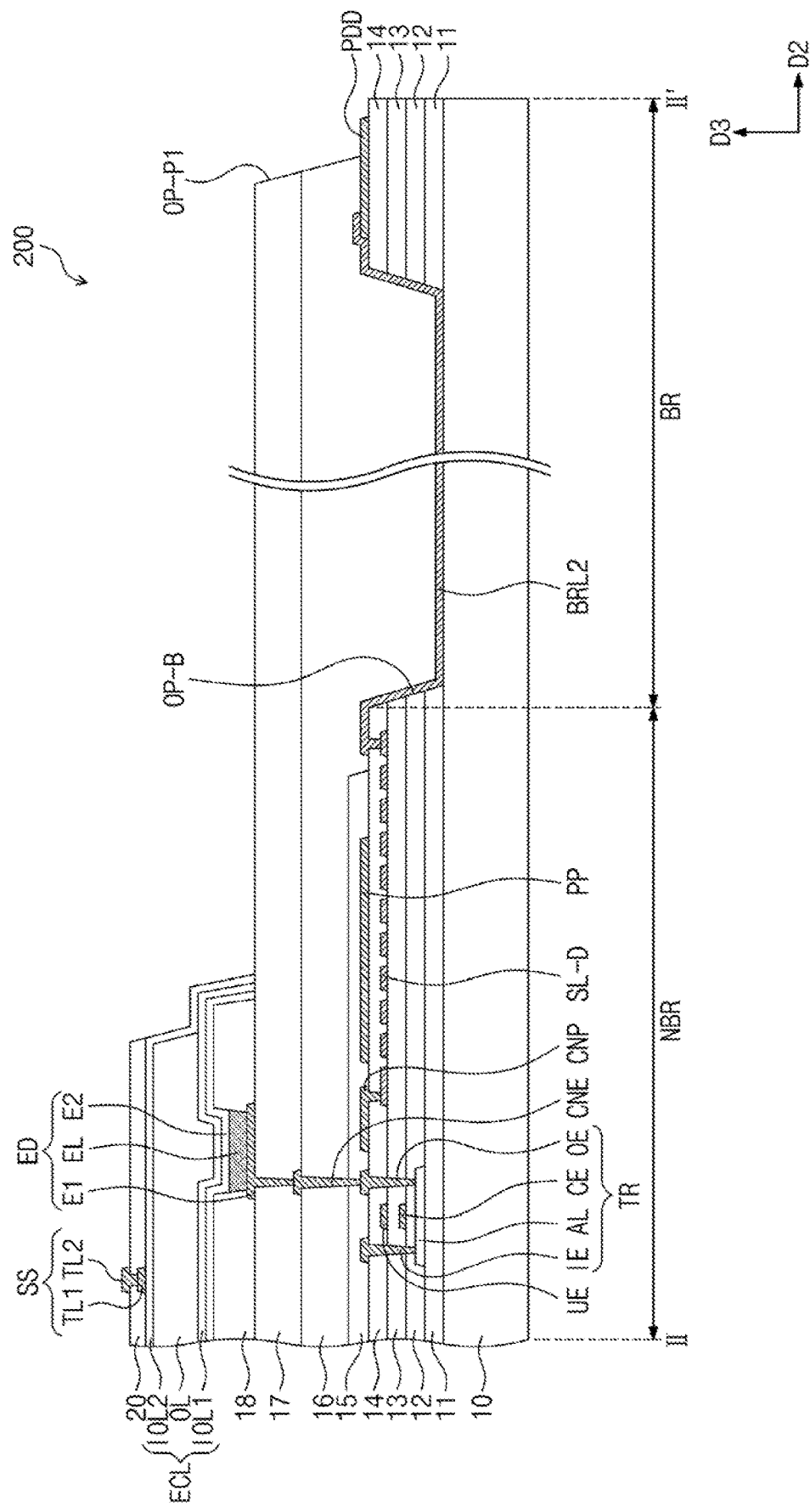
FIG. 3B is a cross-sectional view taken along line II-II' of FIG. 2B according to an embodiment of the present inventive concepts.

FIG. 3A is a cross-sectional view taken along a line I-I' of FIG. 2B, and FIG. 3B is a cross-sectional view taken along a line II-II' of FIG. 2B. For the purpose of ease and convenience in description, FIGS. 3A and 3B illustrate a state in which the display unit 210 and the input sensing unit 220 of the electronic panel 200 are coupled to each other. Hereinafter, an embodiment of the present inventive concepts will be described with reference to FIGS. 3A and 3B. In addition, the same components as described with reference to FIGS. 1A to 2B will be indicated by the same reference numerals or designators, and the descriptions thereto will be omitted.

FIGS. 3A and 3B illustrate an area in which the non-bending portion NBR and the bending portion BR are connected to each other. The electronic panel 200 may include a plurality of insulating layers 11, 12, 13, 14, 15, 16, 17 and 18 and an encapsulation layer ECL, which are disposed between the base substrate 10 and the sensing insulating layer 20. A thin film transistor TR and the light emitting element ED which are connected to each other may be disposed on the base substrate 10. The thin film transistor TR may correspond to the second thin film transistor TR2 illustrated in FIG. 2B.

The thin film transistor TR may include a semiconductor layer AL, a control electrode CE, an input electrode IE, and an output electrode OE. The semiconductor layer AL may include a semiconductor material. A first insulating layer 11 may be disposed on the base substrate 10, and the semiconductor layer AL may be disposed between the first insulating layer 11 and a second insulating layer 12. The first insulating layer 11 may include an inorganic layer. The first insulating layer 11 may include a barrier layer, a buffer layer, or a combination thereof.

The control electrode CE may be disposed between the second insulating layer 12 and a third insulating layer 13. The second insulating layer 12 may be disposed on the first insulating layer 11, and the control electrode CE may be spaced apart from the semiconductor layer AL with the second insulating layer 12 interposed therebetween. A fourth insulating layer 14 and a fifth insulating layer 15 may be sequentially stacked on the third insulating layer 13, and the input electrode IE and the output electrode OE may be disposed between the fourth insulating layer 14 and the fifth insulating layer 15. The input electrode IE and the output electrode OE may penetrate the second to fourth insulating layers 12, 13 and 14 for connection to portions of the semiconductor layer AL, respectively.

In the present embodiment, the electronic panel 200 may further include an upper electrode UE disposed between the third insulating layer 13 and the fourth insulating layer 14. The upper electrode UE may be spaced apart from the control electrode CE with the third insulating layer 13 interposed therebetween. A function of the upper electrode UE may be determined depending on an electrical signal applied thereto. For example, the upper electrode UE may be provided with the same electrical signal as the control electrode CE. In this case, the thin film transistor TR may have a double gate structure including the upper electrode UE and the control electrode CE. Alternatively, in another embodiment, the upper electrode UE and the control electrode CE may be provided with different electrical signals. In this embodiment, the upper electrode UE and the control electrode CE may function as a capacitor that forms a predetermined electric field. However, embodiments of the present inventive concepts are not limited thereto. In another embodiment, the upper electrode UE may be omitted.

In the present embodiment, portions of the insulating layers included in the bending portion BR may be removed. For example, portions of the first to fifth insulating layers 11, 12, 13, 14 and 15 may be removed to form an opening area OP-B in the bending portion BR. A sixth insulating layer 16 may fill the opening area OP-B. The sixth insulating layer 16 may include an organic material. According to the embodiment shown in FIGS. 3A and 3B, the opening area OP-B may be formed in the bending portion BR and may be filled with the sixth insulating layer 16 having high flexibility. The high flexibility of the sixth insulating layer 16 permits the bending stress applied to the bending portion BR to be relaxed and the reliability of the electronic panel 200 may be increased.

In the embodiment shown in FIG. 3A, the light emitting element ED may be disposed on the thin film transistor TR. The sixth insulating layer 16 and a seventh insulating layer 17 which are sequentially stacked may be disposed between the thin film transistor TR and the light emitting element ED. In the present embodiment, the electronic panel 200 may further include a connection electrode CNE disposed between the sixth insulating layer 16 and the seventh insulating layer 17. The connection electrode CNE may penetrate the fifth and sixth insulating layers 15 and 16 for connection to the output electrode OE of the thin film transistor TR. A first electrode E1 of the light emitting element ED may penetrate the seventh insulating layer 17 for electrical connection to the output electrode OE through the connection electrode CNE. According to the embodiment of the inventive concepts, the electronic panel 200 may further include the connection electrode CNE. The inclusion of connection electrodes CNE results in a reduction of a contact resistance between the light emitting element ED and the thin film transistor TR and the reliability of the electrical connection may be increased. However, embodiments of the inventive concepts are not limited thereto. In another embodiment, the connection electrode CNE may be omitted.

The light emitting element ED may include the first electrode E1, an emission layer EL, and a second electrode E2. The first electrode E1 may be connected to the thin film transistor TR as described above and the first electrode E1 may receive an electrical signal from the thin film transistor TR. The second electrode E2 may be connected to the power terminal. The emission layer EL may be disposed in an opening defined in an eighth insulating layer 18. The emission layer EL may emit light in response to a potential difference between the first electrode E1 and the second electrode E2.

The encapsulation layer ECL may include a first inorganic layer IOL1, a second inorganic layer IOL2, and an organic layer OL. The first inorganic layer IOL1 may cover the light emitting element ED. The organic layer OL may be disposed between the first inorganic layer IOL1 and the second inorganic layer IOL2. The organic layer OL may have a flat top surface on which the second inorganic layer IOL2 is disposed. The second inorganic layer IOL2 may cover the organic layer OL. A portion of the first inorganic layer IOL1 may be exposed from the organic layer OL and may be in direct contact with the second inorganic layer IOL2.

In an embodiment, the sensing electrode SS may be disposed on the encapsulation layer ECL. The sensing electrode SS may include a first sensing layer TL1 and a second sensing layer TL2. The first sensing layer TL1 may be disposed between the encapsulation layer ECL and the sensing insulating layer 20. The second sensing layer TL2 may be disposed on the sensing insulating layer 20. In the present embodiment, the first sensing layer TL1 may be a bridge pattern connected to the second sensing layer TL2. However, embodiments of the present inventive concepts are not limited thereto.

The power pattern PP may be disposed between the fourth insulating layer 14 and the fifth insulating layer 15. In the embodiment shown in FIGS. 3A-3B, the power pattern PP may be disposed on the same layer as the input electrode IE and the output electrode OF. Thus, the power pattern PP may be formed simultaneously with the input electrode IE and the output electrode OE in the same process.

The sensing pad PDT may be disposed on the power pattern PP. The sensing pad PDT may overlap with the power pattern PP. In the present embodiment, the sensing pad PDT and the power pattern PP may be disposed on different layers. In an embodiment, there may be at least one layer disposed between the power pattern PP and the sensing pad PDT. For example, the sensing pad PDT may be disposed between the sixth insulating layer 16 and the seventh insulating layer 17. The sensing electrode SS may receive an electrical signal from the outside through the sensing pad PDT.

As shown in the embodiment of FIG. 3A, an opening area OP-T may be formed in the seventh insulating layer 17 to expose the sensing pad PDT. The sensing pad PDT may be connected to other components through the opening area OP-T.

As shown in the embodiment of FIG. 3A, a sensing signal line SL-T may connect the sensing electrode SS to the sensing pad PDT and may be one of the sensing lines SL1 and SL2 (see FIG. 2B). Alternatively, the sensing signal line SL-T may be an additional conductive line that is different from the sensing lines SL1 and SL2. In this embodiment, the sensing signal line SL-T may be connected to one of the sensing lines SL1 and SL2 through a contact hole or may be connected directly to one of the sensing lines SL1 and SL2. Therefore, the sensing signal line SL-T may connect the sensing pad PDT to one of the sensing lines SL1 and SL2.

The power pad PDP may be disposed in the bending portion BR. The power pad PDP may be disposed between the fourth insulating layer 14 and the fifth insulating layer 15. Accordingly, in the present embodiment, the power pad PDP and the power pattern PP may be disposed on the same layer. The power pad PDP may be exposed to the outside through an opening area OP-P1 formed in the fifth insulating layer 15, the sixth insulating layer 16 and the seventh insulating layer 17.

As shown in the embodiment of FIG. 3A, the power pattern PP and the power pad PDP may be connected to each other through a power bridge line BRL1. The power bridge line BRL1 may electrically connect the power pattern PP disposed in the non-bending portion NBR to the power pad PDP disposed in the bending portion BR via the opening area OP-B.

The power bridge line BRL1 may include a material of which flexibility or softness is higher than that of the power pattern PP or the power pad PDP. Therefore, reliability of the power bridge line BRL1 with respect to bending stress may be increased. However, embodiments of the present inventive concepts are not limited thereto. In another embodiment, the power bridge line BRL1 may include the same material as the power pattern PP or the power pad PDP.

In the present embodiment, the power bridge line BRL1 may be disposed on the fourth insulating layer 14. The power bridge line BRL1 may penetrate the fourth insulating layer 14 so as to be connected to a power signal line SL-P. The power signal line SL-P may be disposed on the same layer as data signal lines SL-D. The power pattern PP is connected to the power signal line SL-P by penetrating the fourth insulating layer 14. Therefore the power bridge line BRL1 is connected to each of the power pattern PP and the power pad PDP. However, embodiments of the present inventive concepts are not limited thereto and in other embodiments, the power signal line SL-P may be omitted. In other embodiments, the power bridge line BRL1 may be disposed at one of other various positions to connect the power pad PDP and the power pattern PP.

Referring to the embodiment shown in FIG. 3B, the data pad PDD may be disposed on the fourth insulating layer 14. In the present embodiment, the data pad PDD may be disposed on the same layer as the power pad PDP. Accordingly, a surface to which the first circuit board 310 is connected may be provided on the same insulating layer, and thus the first circuit board 310 may be stably connected to the electronic panel 200. However, embodiments of the inventive concepts are not limited thereto. In another embodiment, the data pad PDD and the power pad PDP may be disposed on different layers.

The data pad PDD may be connected to the data line DL (see FIG. 2B) of the non-bending portion NBR through a data bridge line BRL2. A connection pattern CNP and the data signal lines SL-D are illustrated in FIG. 3B for the purpose of ease and convenience in description. The connection pattern CNP may be disposed on the fourth insulating layer 14 on which the input and output electrodes IE and OE are disposed. The connection pattern CNP may be a conductive pattern disposed on the same layer as the data line DL. The connection pattern CNP may connect the data line DL to the data signal line SL-D.

The data signal lines SL-D may be disposed on a layer different from the layer on which the data line DL is disposed. The data signal lines SL-D may overlap with the power pattern PP. The data signal lines SL-D may be connected to the data line DL through the connection pattern CNP and may be connected to the data pad PDD through the data bridge line BRL2. According to the embodiment of the present inventive concepts, the electronic panel 200 may further include the data signal lines SL-D and the data signals that are different from the power signal may be transmitted to an area overlapping with the power pattern PP.

The data bridge line BRL2 may include a material of which flexibility or softness is higher than that of the data signal lines SL-D or the data pad PDD. Therefore, the data bridge line BRL2 may have an increased reliability with respect to bending stress. However, embodiments of the present inventive concepts are not limited thereto. In another embodiment, the data bridge line BRL2 may include the same material as the data signal lines SL-D or the data pad PDD.

According to embodiments of the present inventive concepts, the sensing pad PDT for providing a voltage to the sensing electrode SS disposed on the encapsulation layer ECL may be provided on a different layer than the layer on which the power pattern PP is disposed. Therefore, the power pattern PP and the sensing pad PDT may overlap with each other. As a result, a space in which the power pattern PP is disposed may be secured independently of a space in which the sensing pad PDT is disposed, and a short therebetween may be prevented. Consequently, the reliability of the electronic panel 200 may be increased.

Figure 4:
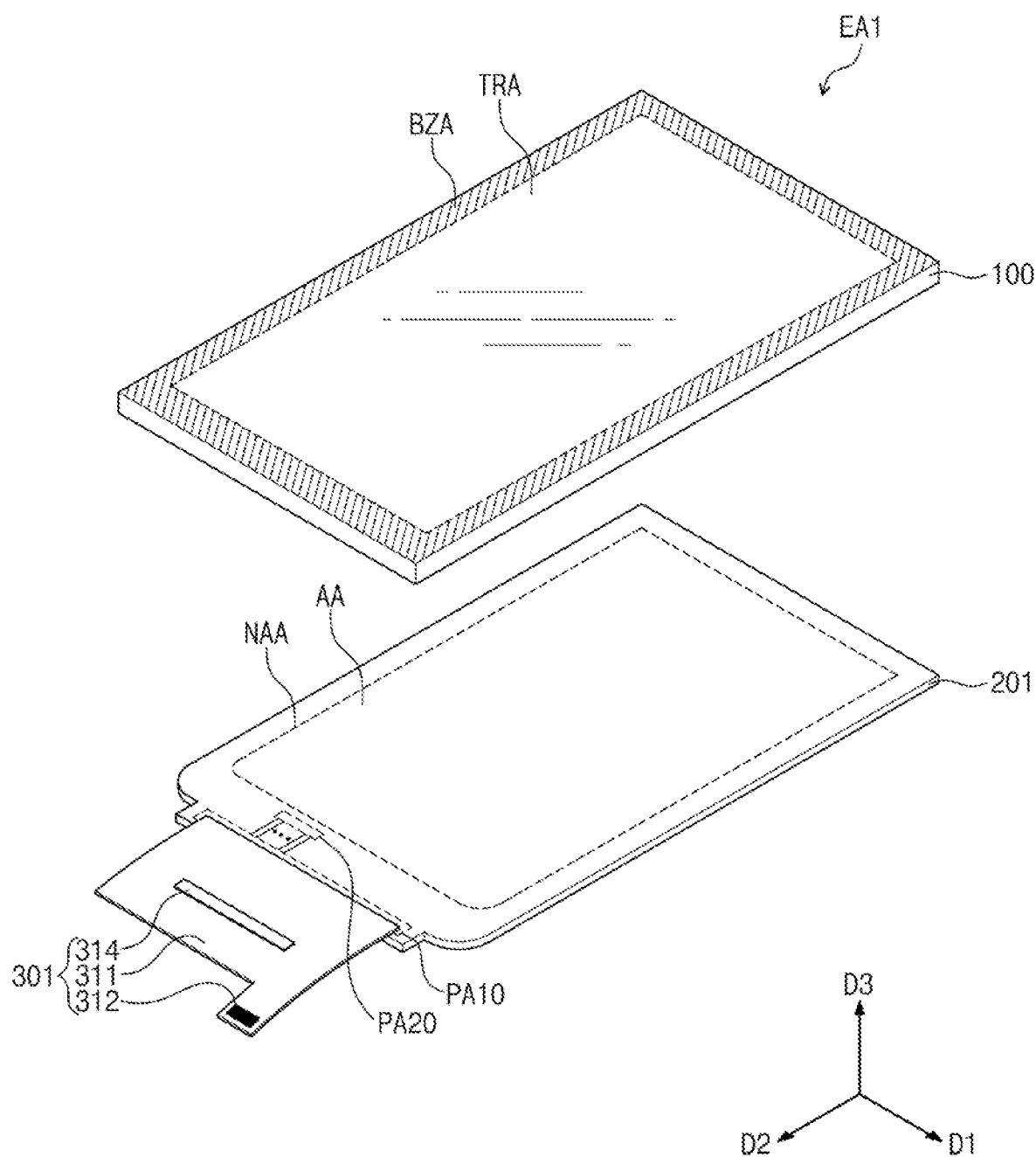
FIG. 4 is an exploded perspective view illustrating an electronic apparatus according to an embodiment of the present inventive concepts.
Figure 5:
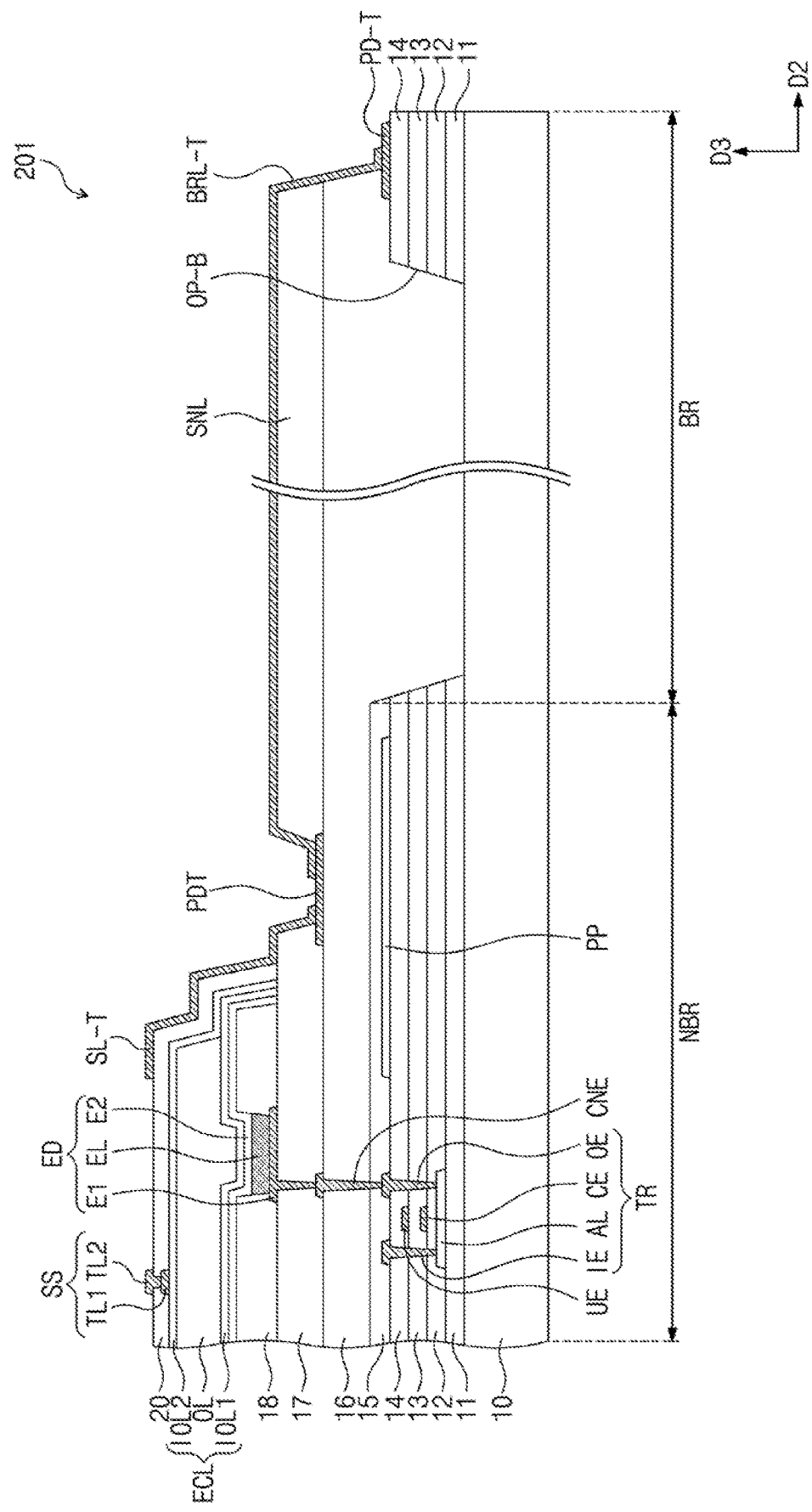
FIG. 5 is a cross-sectional view illustrating a portion of an electronic apparatus according to an embodiment of the present inventive concepts.

FIG. 4 is an exploded perspective view illustrating an electronic apparatus according to an embodiment of the present inventive concepts, and FIG. 5 is a cross-sectional view illustrating a portion of an electronic apparatus according to an embodiment of the present inventive concepts. For the purpose of ease and convenience in description, FIG. 4 corresponds to FIG. 1A, and FIG. 5 illustrates an area corresponding to FIG. 3A. Hereinafter, an embodiment of the present inventive concepts will be described with reference to FIGS. 4 and 5. In addition, the same components as described with reference to FIGS. 1A to 3B will be indicated by the same reference numerals or designators, and the descriptions thereto will be omitted.

An electronic apparatus EA may include an electronic panel 201 and a circuit board 301. The electronic panel 201 may include a first pad area PA10 and a second pad area PA20.

The circuit board 301 may be connected to the electronic panel 201 through the first pad area PA10. The circuit board 301 may include a main board 311, an electronic device 312, and a sensing driving device 314. The main board 311 and the electronic device 312 may correspond to the main board 311 and the electronic device 312 of FIG. 1A, and thus detailed descriptions thereto will be omitted. The sensing driving device 314 may provide a driving signal to a sensing electrode SS and/or may receive and process a sensing signal provided from the sensing electrode SS.

The sensing driving device 314 may be a component mounted on the second circuit board 320 of FIG. 1A or mounted on the main board 311. In the present embodiment, the second circuit board 320 may be omitted. Therefore, the second pad area PA20 may not be connected to a separate circuit board.

The sensing pad PDT may be disposed in the non-bending portion NBR. The sensing pad PDT may be disposed on the power pattern PP. The sensing pad PDT may overlap with the power pattern PP.

The electronic panel 201 may further include a bridge line BRL-T (hereinafter, referred to as a sensing bridge line BRL-T) which connects the second pad area PA20 to the first pad area PA10. The sensing bridge line BRL-T may connect the sensing pad PDT disposed in the second pad area PA20 to a main pad PD-T disposed in the first pad area PA10. Therefore, in the present embodiment, the electronic panel 201 may further include the main pad PD-T disposed in the first pad area PA10.

The electronic panel 201 may transmit an electrical signal, provided through the main pad PD-T, to the sensing pad PDT through the sensing bridge line BRL-T. The sensing pad PDT may provide the transmitted electrical signal to the sensing electrode SS to sense an external input.

The sensing bridge line BRL-T may pass through the bending portion BR for connection to the sensing pad PDT. The sensing bridge line BRL-T may be disposed on a layer different from a layer on which the power pattern PP is disposed. In addition, the sensing bridge line BRL-T may be disposed on a layer different from a layer on which the power bridge line BRL1 (see FIG. 3A) or the data bridge line BRL2 (see FIG. 3B) is disposed. Accordingly, it is possible to minimize interference between electrical signals respectively provided to the display unit and the input sensing unit.

The sensing bridge line BRL-T may include a material having a higher flexibility or softness than that of the sensing pad PDT or the main pad PD-T. Therefore, the sensing bridge line BRL-T may have increased reliability with respect to bending stress. However, embodiments of the present inventive concepts are not limited thereto. In another embodiment, the sensing bridge line BRL-T may include the same material as the sensing pad PDT or the main pad PD-T.

According to an embodiment of the present inventive concepts, a portion of the circuit board 301, which is configured to provide an electrical signal to the sensing electrode SS, may also be connected to the first pad area PA10 by the sensing bridge line BRL-T. According to the embodiment, the power pad PDP (see FIG. 2B), the data pad PDD (see FIG. 2B) and the main pad PD-T may be provided in one pad area PA10. Therefore, an additional component such as the second circuit board 320 may be omitted. This may result in a reduction of production costs.

Figure 6:
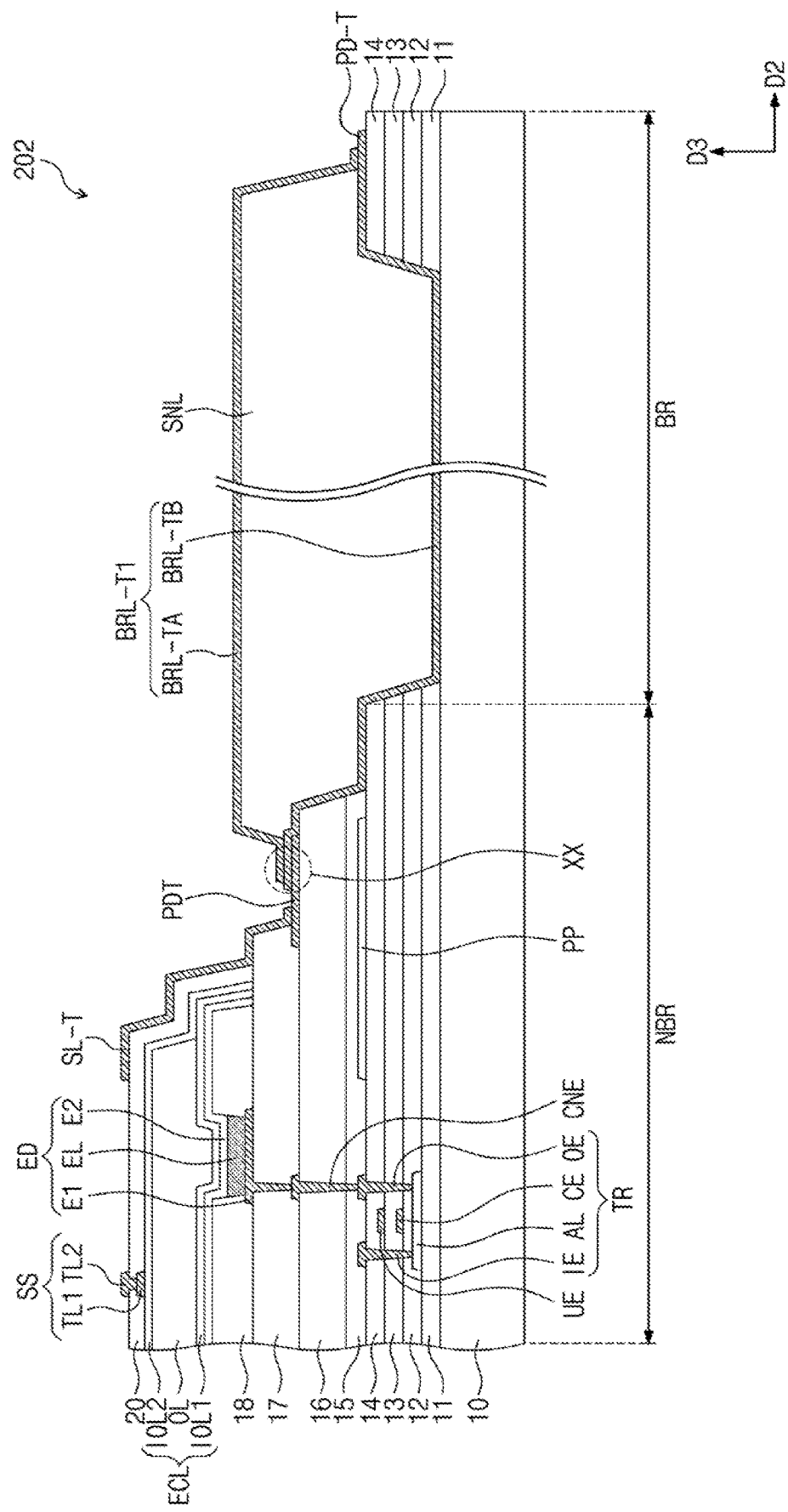
FIG. 6 is a cross-sectional view illustrating a portion of an electronic panel according to an embodiment of the present inventive concepts.

FIG. 6 is a cross-sectional view illustrating a portion of an electronic panel according to an embodiment of the present inventive concepts. FIG. 6 illustrates an area corresponding to FIG. 5 for the purpose of ease and convenience in description. Hereinafter, an embodiment of the inventive concepts will be described with reference to FIG. 6. In addition, the same components as described with reference to FIGS. 1A to 5 will be indicated by the same reference numerals or designators, and the descriptions thereto will be omitted.

As illustrated in FIG. 6, an electronic panel 202 may include a sensing bridge line BRL-T1 which may include a plurality of lines. The sensing bridge line BRL-T1 may include a first line BRL-TA and a second line BRL-TB. The first line BRL-TA and the second line BRL-TB may be connected to the main pad PD-T and the sensing pad PDT through the bending portion BR. In the present embodiment, the main pad PD-T may be a portion of the second line BRL-TB. However, embodiments of the present inventive concepts are not limited thereto. In another embodiment, the main pad PD-T may be provided as a separate pattern.

A stress relaxation layer SNL may be additionally disposed between the first line BRL-TA and the second line BRL-TB. The stress relaxation layer SNL may include an organic material. In an embodiment, the stress relaxation layer SNL may include the same material as at least one of the sixth insulating layer 16 or the seventh insulating layer 17. In another embodiment, the stress relaxation layer SNL may include a material of which flexibility or softness is higher than those of the sixth insulating layer 16 and the seventh insulating layer 17. The stress relaxation layer SNL may have a single-layered structure or a multi-layered structure including a plurality of layers.

The first line BRL-TA may extend to the sensing pad PDT via the bending portion BR on the stress relaxation layer SNL. The second line BRL-TB may extend to the sensing pad PDT via the bending portion BR under the stress relaxation layer SNL. A portion of the second line BRL-TB may be disposed on the same layer as the power pattern PP. Referring to an area XX, the first line BRL-TA, the second line BRL-TB and the sensing pad PDT may be in direct contact with each other.

According to the embodiment of the present inventive concepts, the sensing bridge line BRL-T1 extending via the bending portion BR may have a double line structure, and thus it is possible to prevent the sensing bridge line BRL-T1 from being damaged by bending stress. In addition, in the event that one of the first and second lines BRL-TA and BRL-TB is damaged by bending stress, the other line may be maintained to stably transmit an electrical signal.

Figure 7:
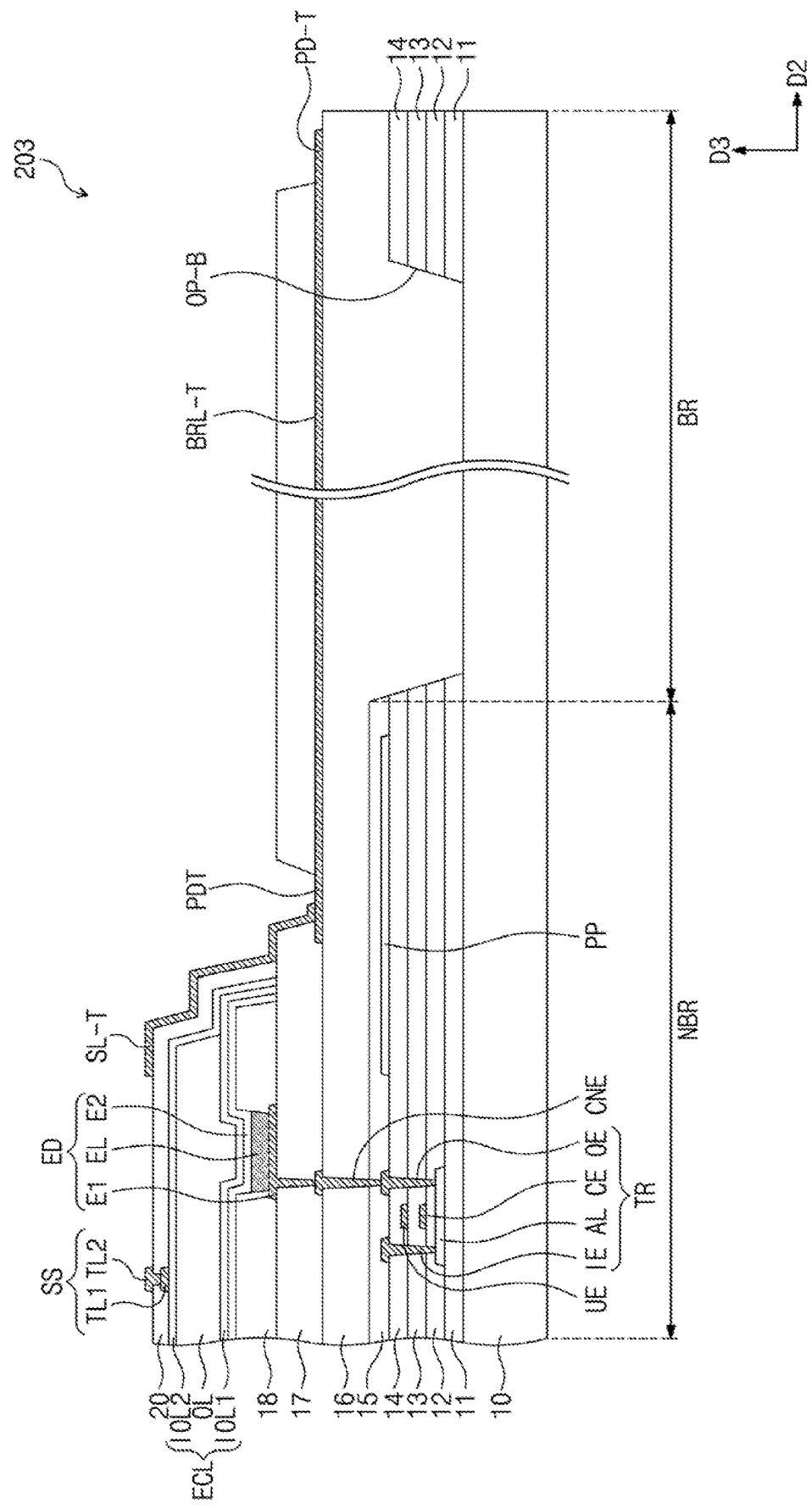
FIG. 7 is a cross-sectional view illustrating a portion of an electronic panel according to an embodiment of the present inventive concepts.

FIG. 7 is a cross-sectional view illustrating a portion of an electronic panel according to an embodiment of the present inventive concepts. FIG. 7 illustrates an area corresponding to FIG. 5 for the purpose of ease and convenience in description. Hereinafter, an embodiment of the present inventive concepts will be described with reference to FIG. 7. In addition, the same components as described with reference to FIGS. 1A to 6 will be indicated by the same reference numerals or designators, and the descriptions thereto will be omitted.

As illustrated in FIG. 7, in an electronic panel 203, a sensing pad PDT, a sensing bridge line BRL-T and a main pad PD-T may be formed as a single unitary body on the same layer. Opening areas exposing portions of a conductive line disposed between the sixth and seventh insulating layers 16 and 17 may be formed in the seventh insulating layer 17. The portion exposed by the opening area of the non-bending portion NBR may be defined as the sensing pad PDT. The portion exposed by the opening area of the bending portion BR may be defined as the main pad PD-T.

The main pad PD-T and the sensing pad PDT may be formed on the same layer. Display pads may be disposed on the same layer as the main pad PD-T, unlike the display pads PDP illustrated in FIG. 3A. Therefore, a step difference between the main pad PD-T and the display pads may be eliminated to prevent connection failure with the circuit board 301. However, embodiments of the inventive concepts are not limited thereto. In another embodiment, the display pad and the main pad PD-T may be disposed on different layers, and a step difference between the display pad and the main pad PD-T may be compensated for by a connection member such as an anisotropic conductive film or a solder particle.

According to the embodiment of the present inventive concepts, the sensing pad PDT, the sensing bridge line BRL-T and the main pad PD-T may be formed using a single conductive line, and thus manufacturing processes may be simplified and process costs may be reduced. However, embodiments of the inventive concepts are not limited thereto. In other embodiments, the stack structure of the electronic panel 203 may be variously designed or modified.

Figure 8A:
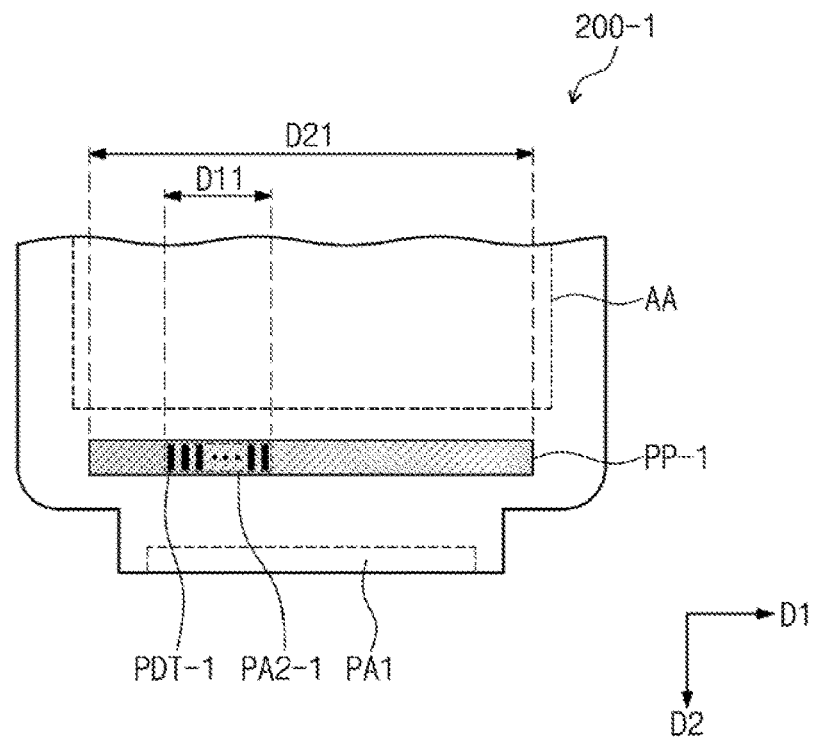
FIGS. 8A to 8C are plan views schematically illustrating electronic panels according to some embodiments of the present inventive concepts.
Figure 8B:
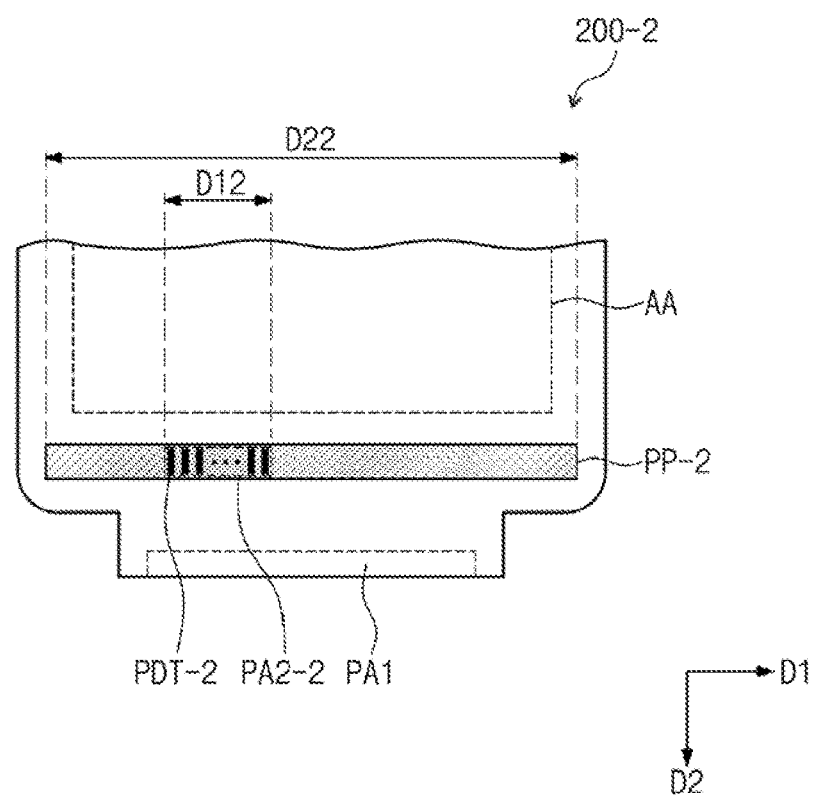
Figure 8C:
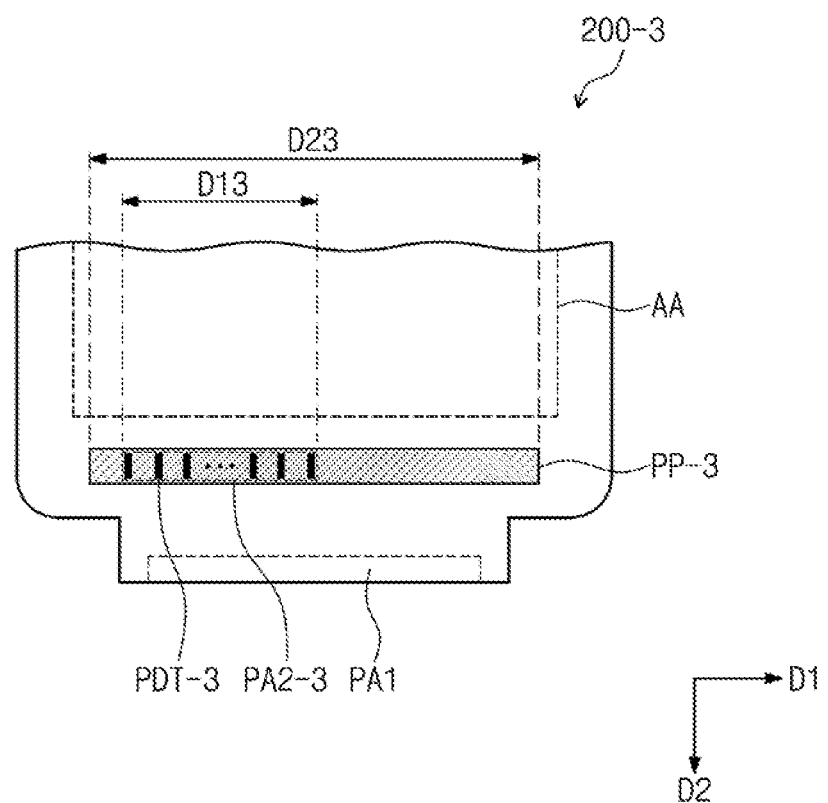

FIGS. 8A to 8C are plan views schematically illustrating electronic panels according to some embodiments of the present inventive concepts. For the purpose of ease and convenience in the description, FIGS. 8A to 8C schematically illustrate position relationships between a power pattern and a sensing pad, and other components are omitted in FIGS. 8A to 8C. Hereinafter, some embodiments of the inventive concepts will be described with reference to FIGS. 8A to 8C. In addition, the same components as described with reference to FIGS. 1A to 7 will be indicated by the same reference numerals or designators, and the descriptions thereto will be omitted.

As illustrated in FIG. 8A, an electronic panel 200-1 may include a power pattern PP-1 and a sensing pad PDT-1 which overlap with each other. A second pad area PA2-1 in which the sensing pad PDT-1 is disposed may overlap with the power pattern PP-1.

According to the embodiment of the present inventive concepts, the sensing pad PDT-1 may be disposed on the power pattern PP-1 and may overlap with the power pattern PP-1. Therefore, a width D1 (hereinafter, referred to as a first width) of the second pad area PA2-1 in the first direction D1 may be equal to or less than a width D21 (hereinafter, referred to as a second width) of the power pattern PP-1 in the first direction D1. In addition, a position of the second pad area PA2-1 may be variously changed in an area defined by the second width D21.

Referring to FIG. 8B, in an electronic panel 200-2, a second width D22 of a power pattern PP-2 may extend beyond the active area AA. The second width D22 of the power pattern PP-2 may be greater than the second width D21 of the power pattern PP-1 illustrated in FIG. 8A. According to an embodiment of the inventive concepts, since the power pattern PP-2 is disposed on a layer different from a layer on which a sensing pad PDT-2 of a second pad area PA2-2 is disposed, a position of the sensing pad PDT-2 may not affect an area in which the power pattern PP-2 is disposed. According to the embodiment of the present inventive concepts, a size, a shape and/or a width of the power pattern PP-2 may be variously designed regardless of the sensing pad PDT-2.

Referring to FIG. 8C, in an electronic panel 200-3, a first width D13 of a second pad area PA2-3 may be greater than the first width D11 illustrated in FIG. 8A. and the second width D23 of the power pattern PP-3 may be equal to the second width D21 of the power pattern PP-1 illustrated in FIG. 8A. When the number of sensing pads PDT-3 is equal to the number of the sensing pads PDT-1 of FIG. 8A, distances between the sensing pads PDT-3 may be increased by the increase in the first width D13. The increased distances between the sensing pads PDT-3 may reduce interference between the sensing pads PDT-3. Therefore, an electrical signal may be stably transmitted through each of the sensing pads PDT-3.

According to the embodiments of the present inventive concepts, the sensing pad PDT-1, PDT-2 or PDT-3 and the power pattern PP-1, PP-2 or PP-3 may be disposed on different layers, and thus the interference therebetween may be minimized or prevented and the two components may be designed independently of each other. As a result, reliability of the electronic panels 200-1, 200-2 and 200-3 may be increased.

According to the embodiments of the present inventive concepts, it is possible to prevent mutual interference between the power pattern and the sensing pad transmitting/receiving an electrical signal for sensing an external input. Therefore, the electrical reliability of the electronic panel may be increased. In addition, according to the embodiments of the present inventive concepts, the reliability of the sensing signal line with respect to bending stress may be increased in the electronic panel of which a portion is bent.

While the inventive concepts have been described with reference to embodiments, it will be apparent to those skilled in the art that various changes and modifications may be made without departing from the spirits and scopes of the present inventive concepts. Therefore, it should be understood that the above embodiments are not limiting, but illustrative. Thus, the scopes of the present inventive concepts are to be determined by the broadest permissible interpretation of the following claims and their equivalents, and shall not be restricted or limited by the foregoing description.

What is claimed is:

1. An electronic apparatus comprising:
a base substrate including an active area and, a peripheral area adjacent to the active area;
a plurality of pixels disposed on the active area;
a plurality of power lines connected to the pixels;
a power pad disposed on the peripheral area and configured to receive a power voltage;
a power pattern disposed on the peripheral area and connecting the power lines to the power pad;
a plurality of sensing electrodes disposed on the pixels in the active area;
a plurality of sensing pads disposed on the peripheral area and electrically connected to the sensing electrodes, the plurality of sensing pads are electrically isolated from the power pad;
a first circuit board connected to the power pad in a first pad area in which the power pad is disposed; and
a second circuit board connected to the sensing pads in a second pad area in which the sensing pads are disposed,
wherein the plurality of sensing pads overlap with the power pattern,
wherein the first circuit board overlaps with the second circuit board and the second pad area is disposed between the first pad area and the active area.

2. The electronic apparatus of claim 1, wherein each of the plurality of pixels comprises:
a thin film transistor that is covered by an insulating layer, the thin film transistor including:
a semiconductor layer;
a control electrode spaced apart from the semiconductor layer;
an input electrode connected to the semiconductor layer; and
an output electrode disposed on the same Mayer as the input electrode and connected to the semiconductor layer; and
a light emitting element which is disposed on the insulating layer, the light emitting element including:
a first electrode;
a second electrode disposed on the first electrode; and
an emission layer disposed between the first electrode and the second electrode,
wherein the sensing pads are disposed between the light emitting element and the thin film transistor.

3. The electronic apparatus of claim 2, wherein the power pattern is disposed on e same layer as the output electrode.

4. The electronic apparatus of claim 3, wherein the insulating layer comprises:
a first layer disposed between the first electrode and the output electrode and covering the output electrode;
a second layer disposed on the first layer; and
a third layer which is disposed on the second layer, wherein the first electrode is disposed on the third layer,
wherein the power pattern is covered by the first layer.

5. The electronic apparatus of claim 4, wherein the sensing pads are disposed between the second layer and the third layer.

6. The electronic apparatus of claim 4, further comprising:
a connection electrode disposed between the second layer and the third layer,
wherein the first electrode penetrates the third layer and is connected to the connection electrode, and
wherein the connection electrode penetrates the first and second layers and is connected to the output electrode.

7. The electronic apparatus of claim 2, wherein the light emitting element comprises an organic light emitting element or a quantum dot light emitting element.

8. The electronic apparatus of claim 1, wherein the base substrate comprises:
a bending portion that is configured to bend about a bending axis extending in one direction; and a non-bending portion connected to the bending portion,
wherein the power pattern and the sensing pad are disposed on the non-bending, portion, and
wherein the power pad is disposed on the bending portion.

9. The electronic apparatus of claim 8, further comprising:
a main pad disposed on the bending portion; and
a bridge line extending in a direction that intersects the bending axis to connect the main pad to the sensing pad.

10. The electronic apparatus of claim 9, wherein the bridge line is in direct contact with the sensing pad.

11. The electronic apparatus of claim 9, wherein the bridge line comprises:
a first line that connects the main pad to the sensing pad; and
a second line that connects the main pad to the sensing pad, the second line including a portion that is spaced apart from the first line,
wherein the first line, the second line and the sensing pad are in direct contact with each other.

12. The electronic apparatus of claim 11, further comprising:
an organic layer disposed on the bending portion,
wherein the organic layer is disposed between the first line and the second line.

13. The electronic apparatus of claim 9, further comprising:
a circuit board connected to the main pad and the power pad,
wherein the sensing electrodes are configured to receive an electrical signal through the circuit board.

14. The electronic apparatus of claim 1, wherein:
the plurality of power lines are arranged and spaced apart from each other in a first direction; and
the power pattern is extended in the first direction and commonly connected to the plurality of power lines.

15. The electronic apparatus of claim 8, further comprising:
a plurality of insulating layers disposed on the base substrate, at least one of the insulating layers partially removed to form an opening area in the bending portion; and
a power bridge line disposed in the opening area to electrically connect the power pattern to the power pad.

16. An electronic apparatus comprising:
an electronic panel comprising a bending portion that is configured to be bent about a bending axis and a non-bending portion connected to the bending portion; and
a circuit board connected to the electronic panel,
wherein the electronic panel includes:
a plurality of pixels disposed in the non-bending portion;
sensing electrodes disposed in the non-bending portion and overlapping with the pixels;
data pads disposed in the bending portion and connected to the circuit board;

power pads disposed in the bending portion and connected to the circuit board;
a power pattern disposed in the non-bending portion, the power pattern connecting the power pads to the pixels; and
sensing pads disposed in the non-bending portion and connected to the sensing electrodes, the sensing pads are electrically isolated from the power pads, wherein the sensing pads overlap with the power pattern,
wherein the circuit board comprises:
a first circuit hoard connected to the data pads and the power pads in a first pad area in which the data pads and the power pads are disposed; and
a second circuit board connected to the sensing pads in a second pad area in which the sensing pads are disposed,
wherein the first circuit board overlaps with the second circuit board, the second pad area is disposed its the non-bending portion and the first pad area is disposed in the bending portion.

17. The electronic apparatus of claim 16, further comprising:
main pads disposed in the bending portion and connected to the circuit board; and
bridge lines extending in a direction intersecting the bending axis, the bridge lines connect the main pads to the sensing pads,
wherein the sensing electrodes are configured to receive an electrical signal through the circuit board.

18. The electronic apparatus of claim 17, further comprising:
a stress relaxation layer disposed in the bending portion and including an organic material,
wherein the bridge line comprises a first line and a second line which are spaced apart from each other and have the stress relaxation layer interposed therebetween.

19. The electronic apparatus of claim 18, wherein the sensing pad, the first line and the second line are stacked.

20. The electronic apparatus of claim 18, wherein the first line is disposed on the second line, and
wherein at least a portion of the second line is disposed on the same layer as the power pattern.

21. The electronic apparatus of claim 16, further comprising:
an encapsulation layer disposed between the pixels and the sensing electrodes and including at least one of an organic layer or an inorganic layer,
wherein the sensing electrodes are disposed directly on the encapsulation layer.

22. The electronic apparatus of claim 16, wherein:
the plurality of power lines are arranged and spaced apart from each other in a first direction; and
the power pattern is extended in the first direction and commonly connected to the plurality of power lines.

23. An electronic apparatus comprising:
a display unit configured to generate and display an image in a display area, the display unit including a power pattern disposed in a non-display area, the power pattern connects a plurality of power lines that are connected to at least one of a plurality of pixels to a power pad;
an input sensing unit configured to sense an external input in a sensing area, the input sensing unit including a plurality of sensing pads electrically connected to sensing electrodes, the plurality of sensing pads are electrically isolated from the power pad;
a first circuit board connected to the power pad in a first pad area in which the power pad is disposed; and
a second circuit board connected to the sensing pads in a second pad area in which the sells pads are disposed,
wherein the sensing pads overlap with the power pattern and at least one layer is disposed between the power pattern and the sensing pads,
wherein the power pattern is commonly connected to the plurality of power lines,
wherein the first circuit board overlaps with the second circuit board, and the second pad area is disposed between the first pad area and the display area.

* * * * *